(12) United States Patent
Hosseini et al.

(10) Patent No.: US 8,912,047 B2
(45) Date of Patent: Dec. 16, 2014

(54) METHOD FOR PRODUCING A METAL LAYER ON A SUBSTRATE AND DEVICE

(75) Inventors: Khalil Hosseini, Weihmichl (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 243 days.

(21) Appl. No.: 13/110,653

(22) Filed: May 18, 2011

(65) Prior Publication Data

US 2012/0292773 A1 Nov. 22, 2012

(51) Int. Cl.
| H01L 21/50 | (2006.01) |
| C23C 4/00 | (2006.01) |
| C23C 4/12 | (2006.01) |
| H01L 21/768 | (2006.01) |
| C23C 4/08 | (2006.01) |
| H01L 23/00 | (2006.01) |

(52) U.S. Cl.
CPC ....... *C23C 4/005* (2013.01); *H01L 2924/01082* (2013.01); *H01L 2924/01074* (2013.01); *H01L 2924/01029* (2013.01); *H01L 2924/01041* (2013.01); *H01L 2924/01023* (2013.01); *H01L 2924/014* (2013.01); *H01L 2924/01033* (2013.01); *H01L 2924/01073* (2013.01); *H01L 2924/10329* (2013.01); *H01L 2224/85* (2013.01); *H01L 2924/01047* (2013.01); *H01L 2224/48463* (2013.01); *H01L 2924/01327* (2013.01); *H01L 2924/01013* (2013.01); *C23C 4/127* (2013.01); *H01L 21/76898* (2013.01); *C23C 4/08* (2013.01); *H01L 2924/01079* (2013.01); *H01L 24/85* (2013.01); *H01L 2924/13091* (2013.01); *H01L 2924/01006* (2013.01); *H01L 2924/13055* (2013.01)
USPC ..... 438/113; 438/610; 438/667; 257/E21.597

(58) Field of Classification Search
USPC .......... 438/113, 610, 667; 257/738, 734, 686, 257/761, 777, 765, 781, 782, E21.597
See application file for complete search history.

(56) References Cited

U.S. PATENT DOCUMENTS

| 7,205,255 | B2 * | 4/2007 | Yamamoto | 502/101 |
| 8,110,906 | B2 * | 2/2012 | Mahler et al. | 257/676 |
| 2003/0017687 | A1 * | 1/2003 | Hembree | 438/586 |
| 2005/0052326 | A1 * | 3/2005 | Gundlach et al. | 343/733 |
| 2007/0196951 | A1 * | 8/2007 | Ma | 438/106 |
| 2007/0231960 | A1 * | 10/2007 | Pavier et al. | 438/106 |
| 2010/0108952 | A1 * | 5/2010 | Shim et al. | 252/512 |
| 2010/0304045 | A1 * | 12/2010 | Bisges | 427/569 |

FOREIGN PATENT DOCUMENTS

| DE | 10 2007 043 291 A1 | 4/2009 |
| EP | 0708582 | 4/1996 |

* cited by examiner

*Primary Examiner* — Trung Q Dang
(74) *Attorney, Agent, or Firm* — Slater & Matsil, L.L.P.

(57) ABSTRACT

A method produces a metal layer on a semiconductor substrate. A metal layer is produced on the semiconductor substrate by depositing metal particles. The metal particles include cores made of a first metal material and shells surrounding the cores. The shells are made of a second metal material that is resistant to oxidation.

24 Claims, 9 Drawing Sheets

METHOD FOR PRODUCING A METAL LAYER ON A SUBSTRATE AND DEVICE

TECHNICAL FIELD

This invention relates to a method for producing a metal layer on a substrate. The invention further relates to a device including a semiconductor chip and a metal layer applied to an electrode of the semiconductor chip.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging semiconductor chips increases the cost and complexity of manufacturing semiconductor devices because the packaging designs not only provide protection, they also permit transmission of electrical signals to and from the semiconductor chips and, in particular, removal of heat generated by the semiconductor chips.

In order to allow electrical access to the integrated circuits in the semiconductor chips, copper layers are deposited on the semiconductor chips. The copper layers may, however, be subject to oxidation which impedes subsequent manufacturing processes, such as die bonding, wire bonding and molding.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1A:
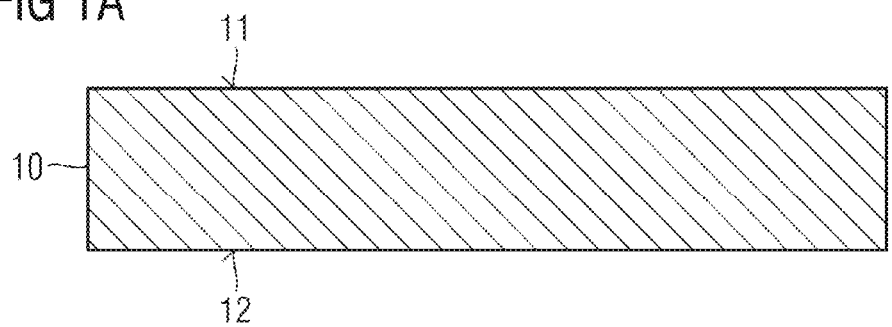
FIGS. 1A-1B schematically illustrate a cross-sectional view of one embodiment of a method for depositing a metal layer on a semiconductor substrate.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Semiconductor substrates with metal layers deposited on one or more surfaces of the semiconductor substrates are described below. In one embodiment, the semiconductor substrates are wafers made of semiconductor material, such as a silicon crystal or any other appropriate semiconductor material. The semiconductor wafers serve as substrates for electronic devices built in and over the semiconductor wafers and undergo many microfabrication process steps, such as doping, ion implantation, etching, deposition of various materials, and patterning. Finally, the semiconductor wafers are diced thereby separating individual semiconductor chips.

In one embodiment, the semiconductor substrates are semiconductor chips. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones, etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow through the semiconductor material in a direction perpendicular to the main surfaces of the semiconductor chips. A semiconductor chip having a vertical structure may have electrodes (or contact pads) in particular on its two main faces, that is to say on its top side and bottom side. In other words, a semiconductor chip having a vertical structure has an active top side and an active bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. Furthermore, the devices described below may include integrated circuits to control the power semiconductor chips.

Metal particles are deposited on the semiconductor substrates to form metal layers. The metal particles include cores made of a first metal material and shells surrounding the cores. The shells are made of a second metal material that is highly resistant to oxidation. In particular, the second metal material is resistant to oxidation up to a temperature of less than 220° C. or, in an alternative embodiment, 200° C. In particular, the metal layers are formed over electrodes of the semiconductor substrates. Thus, the metal layers formed on the semiconductor substrates allow electrical contact to be made with the integrated circuits included in the semiconductor substrates. The metal layers may form contact pads, in particular, external contact pads. Surfaces of the metal layers may be at least partially exposed, i.e., not covered with other material. The exposed surfaces of the metal layers can be used for wire bonding, die bonding and/or molding.

FIG. 1A schematically illustrates a cross-sectional view of a semiconductor substrate 10 having a first main surface 11 and a second main surface 12 opposite to the first main surface 11. In one embodiment, the semiconductor substrate 10 is a semiconductor wafer. In one embodiment, the semiconductor substrate 10 is a semiconductor chip produced from a semiconductor wafer by dicing the semiconductor wafer.

Figure 1B:
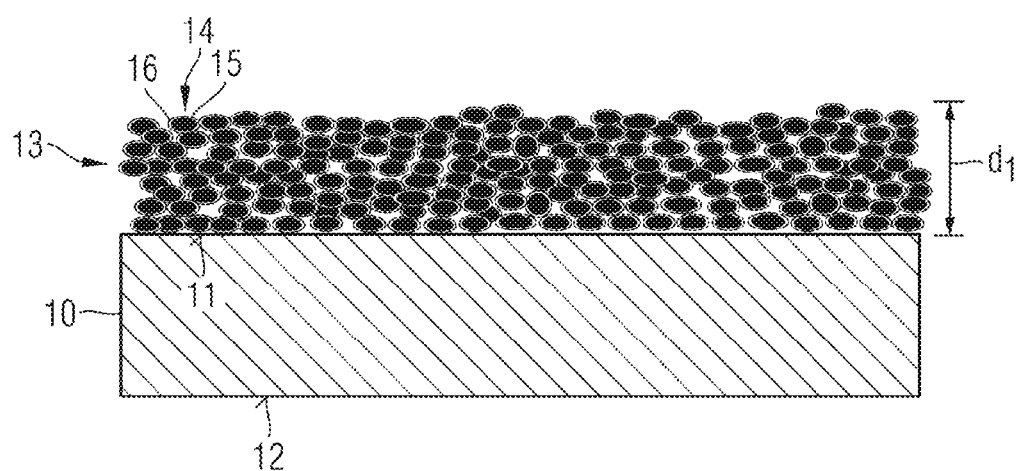

FIG. 1B schematically illustrates a metal layer 13 applied to the first main surface 11 of the semiconductor substrate 10. The metal layer 13 is produced by depositing metal particles 14 on the semiconductor substrate 10. Each of the metal particles 14 includes a core 15 made of a first metal material and a shell 16 surrounding the core 15. The shells 16 are made of a second metal material that is highly resistant to oxidation. In one embodiment, the second metal material is resistant to oxidation up to a temperature of 220° C. In one embodiment, the second metal material is resistant to oxidation up to a temperature of 200° C. In one embodiment, the metal layer 13 has a thickness $d_1$ in the range from 1 µm to 200 µm. In one embodiment, the thickness $d_1$ is larger than 200 µm.

Figure 2:
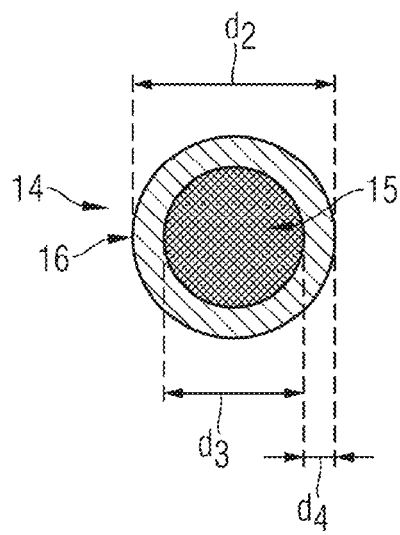
FIG. 2 schematically illustrates a cross-sectional view of one embodiment of a metal particle including a core and a shell.

FIG. 2 schematically illustrates a cross-sectional view of one of the metal particles 14, which is used for producing the metal layer 13 illustrated in FIG. 1B. The metal particle 14 has a core 15 made of the first metal material, which may, for example, be copper or aluminum. The core 15 may entirely consists of one of copper and aluminum. The shell 16 may fully surround the core 15. In one embodiment, the second metal material, which is used for the shell 16, is a noble metal. In one embodiment, the second metal material is one of silver, gold, palladium, titanium, tantalum and niobium. Since the second metal material is resistant to corrosion and shields the first metal material, the core 15 is protected against corrosion by the shell 16.

The metal particles 14 may have any appropriate shape, for example, a spherical or roughly spherical shape. The shape of the metal particles 14 does not have to follow a geometric shape and may vary for different metal particles 14. An average diameter $d_2$ of the metal particles 14 may be in the range from 300 nm to 1 µm and, in particular, in the range from 500 nm to 1 µm. In one embodiment, the average diameter $d_2$ of the metal particles 14 is larger than 1 µm. An average diameter $d_3$ of the core 15 may be in the range from 100 nm to 1 µm and, in particular, in the range from 100 nm to 500 nm. An average thickness $d_4$ of the shell 16 may be in the range from 100 nm to 500 nm. In one embodiment, the average diameter $d_3$ of the core 15 is in the range from 20% to 80% of the average diameter $d_2$ of the entire metal particle 14.

Figure 3:
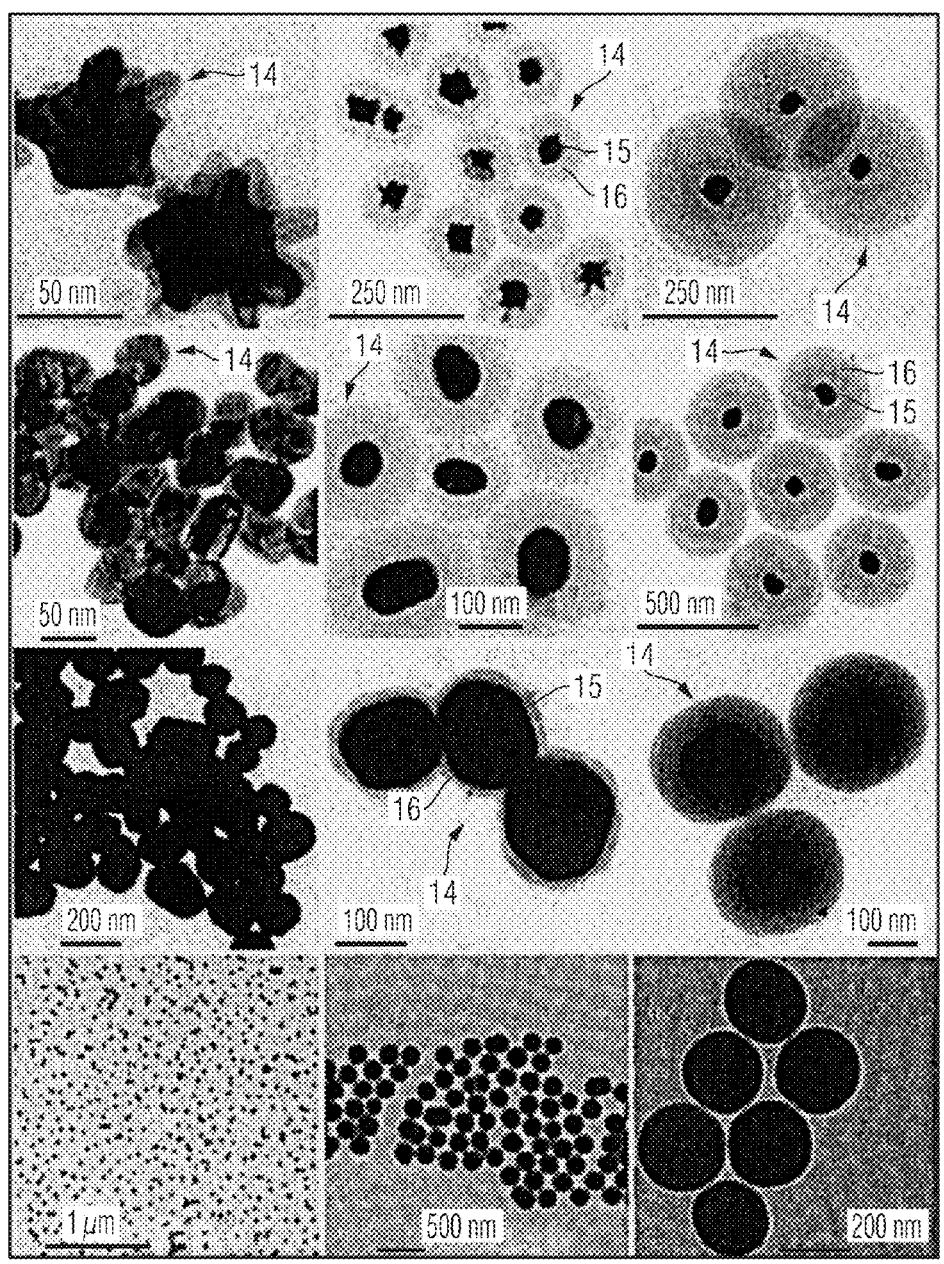
FIG. 3 shows images of various metal particles.

FIG. 3 shows images of various metal particles 14 having different shapes and different dimensions.

Figure 4:
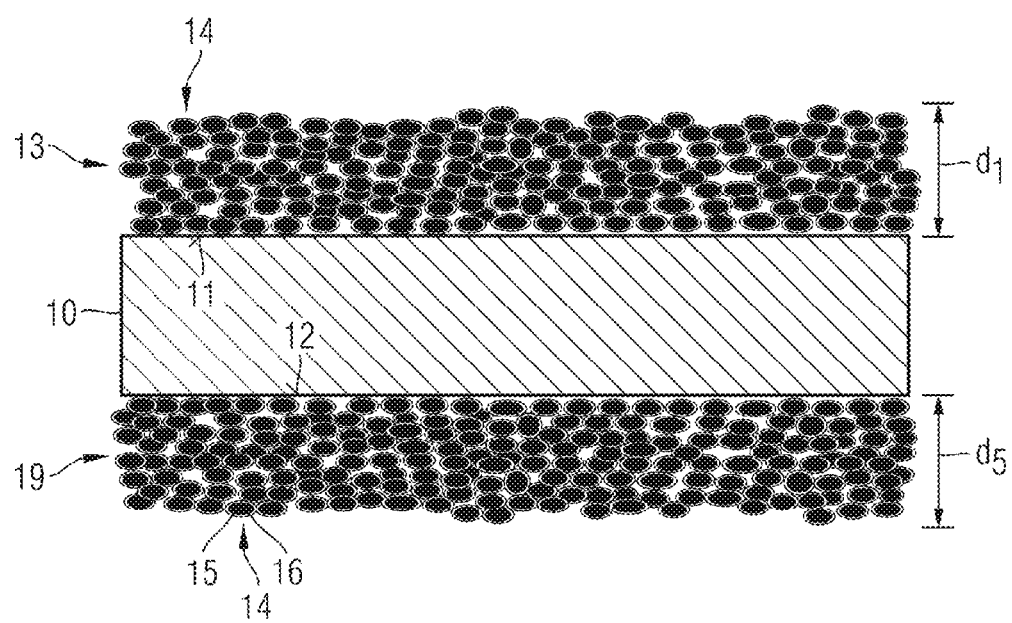
FIG. 4 schematically illustrates a cross-sectional view of one embodiment of a semiconductor substrate coated with two layers made of metal particles.

FIG. 4 schematically illustrates a cross-sectional view of the semiconductor substrate 10 where the metal layer 13 is applied to the first main surface 11 and a metal layer 19 is applied to the second main surface 12 of the semiconductor substrate 10. Both metal layers 13 and 19 are produced by depositing the metal particles 14 described above on the semiconductor substrate 10. In one embodiment, the metal layers 13 and 19 have a thickness $d_1$ and $d_5$ in the range from 1 µm to 200 µm, respectively. In one embodiment, at least one of the thicknesses $d_1$ and $d_5$ is larger than 200 µm. The metal layers 13 and 19 may have a surface roughness in the range from 300 nm to 500 nm. This surface roughness may improve the adhesion of a molding compound layer on the metal layers 13 and 19.

In one embodiment, the semiconductor substrate 10 is a wafer made of semiconductor material, such as a silicon crystal or any other appropriate semiconductor material. The surface area of the semiconductor wafer 10 may be standardized according to predetermined wafer diameters, for example, 4 inches, 8 inches, 10 inches or 12 inches. The thickness of the semiconductor wafer 10 may vary within ranges of typically 100 µm to 1500 µm, where these values may also be smaller or larger in specific applications. The semiconductor wafer 10 may be thinned, for example, by grinding its back side, down to a thickness in the range from 30 µm to 200 µm. The semiconductor wafer 10 serves as the substrate for electronic devices built in and over the semiconductor wafer 10 and undergoes many microfabrication process steps, such as doping or ion implantation, etching, deposition of various materials, and patterning. Finally, the individual semiconductor chips are separated by dicing the semiconductor wafer 10. The first and second main surfaces 11, 12 as illustrated in FIG. 4 may be the front side and back side of the semiconductor wafer 10, respectively.

The purpose of the metal layers 13 and 19 is to make electrical contact to electrodes (or contact pads) embedded in the semiconductor wafer 10 which allow electrical contact to be made with the integrated circuits included in the semiconductor wafer 10. In one embodiment, the metal layers 13 and/or 19 are deposited onto the entire surfaces 11 and 12, respectively, without any further structuring of the metal layers 13 and/or 19. In one embodiment, at least one of the metal layers 13 and 19 is structured after its deposition. Structuring may, for example, be performed by using a photolithographic process. For this purpose, a photoresist layer is printed or spin-coated on top of the metal layer 13, 19 to be structured. By exposure to light having a suitable wavelength through a mask and subsequent development, recesses are formed in the photoresist layer. Subsequently, the portion of the metal layer 13, 19 exposed by the recesses is removed in an etching process. Afterwards, the photoresist layer is stripped away by using an appropriate solvent. The structured metal layers 13, 19 may be manufactured with any desired geometric shape.

In order to obtain individual semiconductor chips, the semiconductor wafer 10 is singulated, for example, by sawing, laser ablation, cutting, etching or any other appropriate technique.

Figure 5:
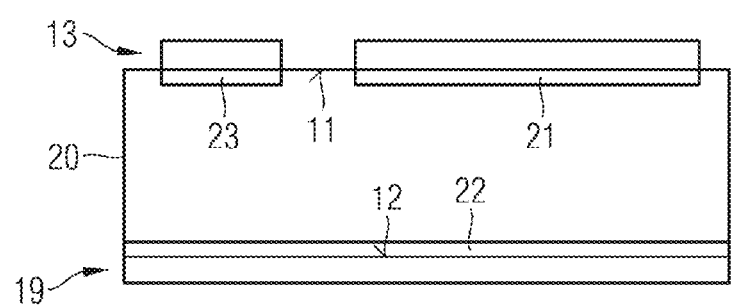
FIG. 5 schematically illustrates a cross-sectional view of one embodiment of a power semiconductor chip with contact pads made of metal particles.

FIG. 5 schematically illustrates a cross-sectional view of a semiconductor chip 20 obtained by the process steps described above. In one embodiment, the semiconductor chip 20 is a power diode or a power transistor, such as a power MOSFET, an IGBTs, a JFET or a power bipolar transistor. The semiconductor chip 20 has a vertical structure and has a first load electrode 21 on the first main surface 11 and a second load electrode 22 on the second main surface 12. Further, the power semiconductor chip 20 may have a control electrode 23 on the first main surface 11. In the case of a power MOSFET, which is exemplarily illustrated in FIG. 5, the first and second load electrodes 21 and 22 are source and drain electrodes, respectively, and the control electrode 23 is a gate electrode. During operation, voltages of up to 5, 50, 100, 500 or 1000 V or even higher may be applied between the load electrodes 21 and 22. The switching frequency applied to the control electrode 23 may be in the range from 1 kHz to 100 MHz, but may also be outside this range.

The electrodes 21-23 are integrated into the semiconductor material of the semiconductor chip 20. The semiconductor material may be doped to a certain degree at the locations of the electrodes 21-23 in order to produce electrical conductivity. The metal layers 13 and 19 including the metal particles 14 as described above in connection with FIG. 2 are deposited on the first and second main surface 11 and 12 of the semiconductor chip 20, respectively. Since two electrodes 21 and 23 are located on the first main surface 11, the metal layer 13 is structured there. The metal layer 19 covers the entire second main surface 12 of the semiconductor chip 20 as the electrode 22 extends over the entire second main surface 12. The metal layers 13 and 19 as illustrated in FIG. 5 can serve as contact pads to provide electrical access to the integrated circuits embedded in the semiconductor chip 20.

Figure 6:
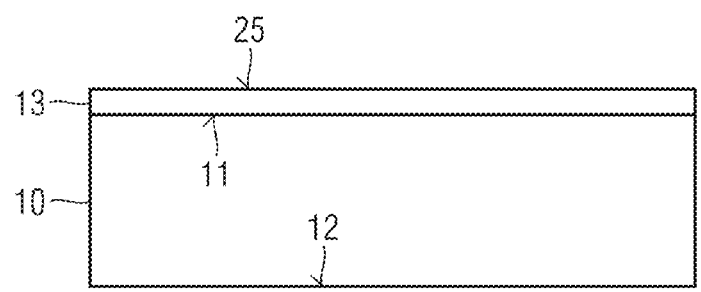
FIG. 6 schematically illustrates a cross-sectional view of one embodiment of a semiconductor substrate and metal particles deposited directly onto the semiconductor substrate.

FIG. 6 schematically illustrates a cross-sectional view of the semiconductor substrate 10 where the metal layer 13 including the metal particles 14 is deposited directly onto the semiconductor material of the semiconductor substrate 10. A surface 25 of the metal layer 13 facing away from the semiconductor substrate 10 is exposed, i.e., no other metal is deposited on the surface 25. The surface 25 can, for example, be used for attaching the semiconductor substrate 10 to a carrier, such as a leadframe, or for attaching bonding wires.

Figure 7:
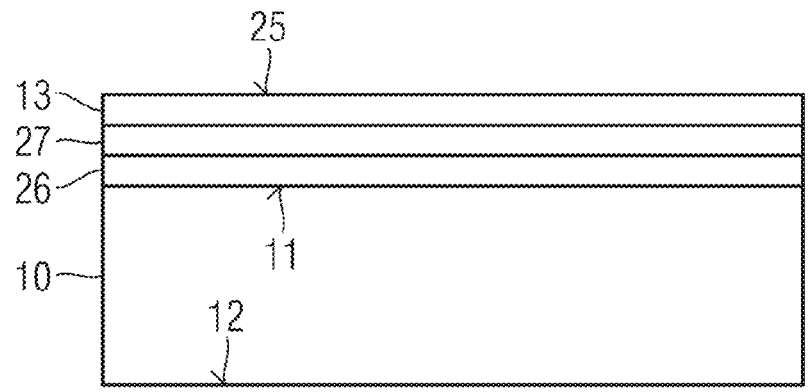
FIG. 7 schematically illustrates a cross-sectional view of one embodiment of a semiconductor substrate and several metal layers deposited on the semiconductor substrate.

FIG. 7 schematically illustrates a cross-sectional view of the semiconductor substrate 10 where metal layers 26 and 27 are arranged between the semiconductor substrate 10 and the metal layer 13. The metal layer 26 may consist of aluminum or any other appropriate metal or metal alloy and serves to make an electrical contact to the doped portions of the semiconductor substrate 10. The metal layer 27 functions as a diffusion barrier which protects the semiconductor material of the semiconductor substrate 10 during a soldering process. Another function of the metal layer 27 may be that of an adhesion layer, which enables the metal layer 13 to adhere to the semiconductor substrate 10. The metal layer 27 may, for example, consist of titanium, titanium tungsten, titanium nitride or other appropriate metals or metal alloys.

Figure 8:
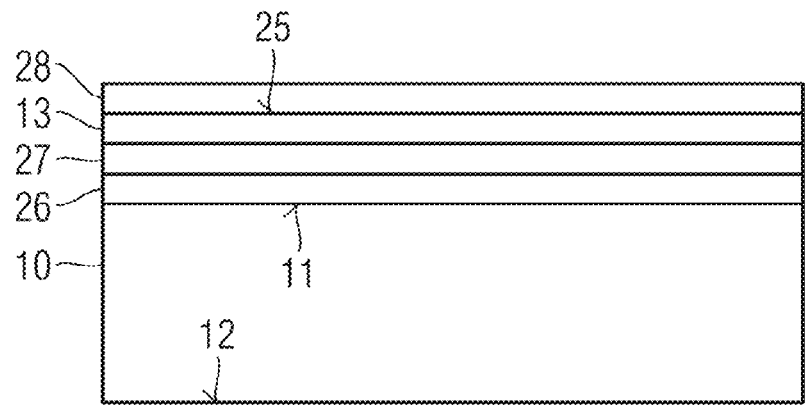
FIG. 8 schematically illustrates a cross-sectional view of one embodiment of a semiconductor substrate and a solder layer deposited on the semiconductor substrate.

FIG. 8 schematically illustrates a cross-sectional view of the semiconductor substrate 10 with the metal layers 26, 27 and 13 deposited on the first main surface 11 as illustrated in FIG. 7. By contrast to the embodiment of FIG. 7 where the surface 25 of the metal layer 13 is exposed, the surface 25 is coated with a layer 28 of solder material in the embodiment of FIG. 8. The solder material may, for example, consist of one or more of AuSn, AgSn, CuSn, Sn, AgIn and CuIn.

The metal layers 26-28 as described above and illustrated in FIGS. 6-8 may be applied to the second main surface 12 of the semiconductor substrate 10 as well.

Figure 9:
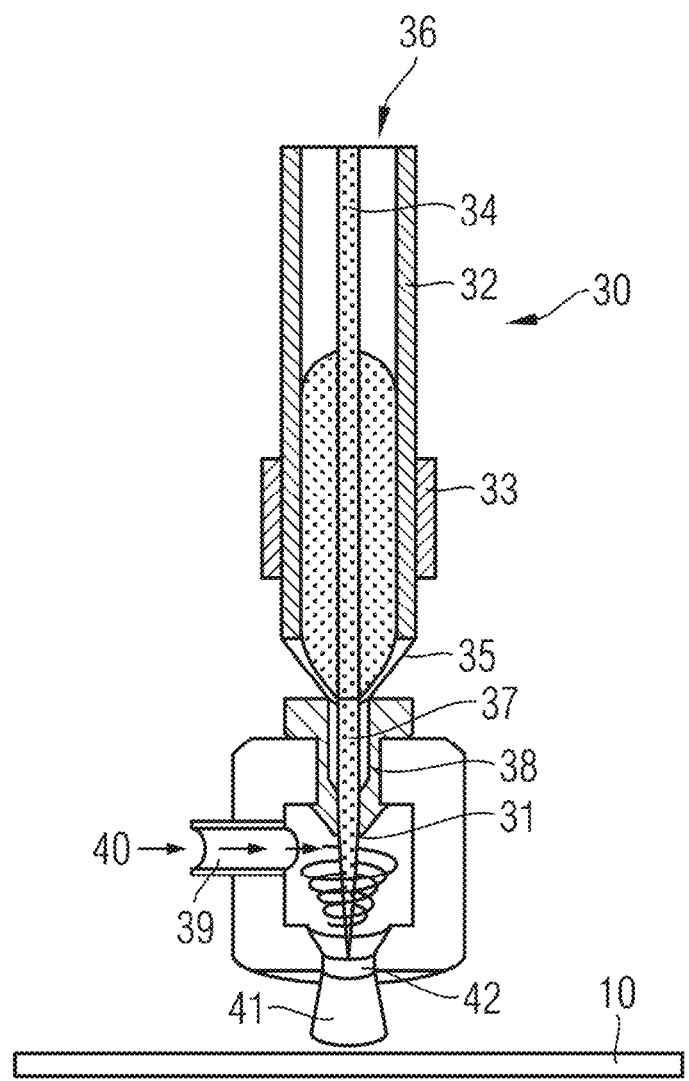
FIG. 9 schematically illustrates a cross-sectional view of a plasma deposition apparatus.

Various techniques may be employed to deposit the metal particles 14 as illustrated in FIG. 2 on the semiconductor substrate 10, for example, spraying, printing or dispensing. In one embodiment, heat and/or pressure is applied to the metal particles 14 after the deposition in order to improve the mechanical stability of the metal layer 13. In one embodiment, a plasma deposition apparatus as schematically illustrated in FIG. 9 is used for the deposition of the metal particles 14.

The plasma deposition apparatus consists of a plasma jet (or beam) generator 30 and a reaction chamber 31 which is physically separated from the plasma jet generator 30.

The plasma jet generator 30 includes a dielectric barrier 32, for example, an electrically insulating tube, an outer electrode 33, which concentrically surrounds the dielectric barrier 32, and an inner electrode 34, which is accommodated at least partially within the dielectric barrier 32. The plasma jet generator 30 is completed at one end by a plasma head 35.

When operating the plasma jet generator 30, a glow discharge is generated by applying an appropriate voltage to the two electrodes 33 and 34. In the direction indicated by an arrow 36 in FIG. 9 a process gas is supplied, thereby generating a plasma jet 37. The plasma jet 37 leaves the plasma jet generator 30 via the plasma head 35.

The plasma jet generator 30 is connected to the reaction chamber 31 via an opening 38 in the reaction chamber 31 to allow the plasma jet 37 to flow into the reaction chamber 31. The opening 38 may be sealed against the opening of the plasma head 35 in order to avoid the entry of ambient air into the reaction chamber 31. The reaction chamber 31 is physically separate from the generation of the plasma jet 37.

The reaction chamber 31 has an inlet 39 which allows a carrier gas 40 to be blown into the reaction chamber 31. The carrier gas 40 is introduced into the reaction chamber 31 and mixed with the generated plasma jet 37 such that the carrier gas 40 is activated or a particle beam is generated. The activated carrier gas 41 leaves the reaction chamber 31 via an outlet 42. The semiconductor substrate 10 is positioned such that the activated carrier gas 41 coats the surface of the semiconductor substrate 10.

As shown in FIG. 9, the inlet 39 for the carrier gas 40 may be arranged laterally to the plasma jet 37 so that the carrier gas 40 is introduced into the reaction chamber 31 such that a swirl or a deflection of the plasma jet 37 is effected.

The carrier gas 40 contains the metal particles 14 as illustrated in FIG. 2 to be deposited on the semiconductor substrate 10. The gas stream and/or particle stream in the carrier gas 40 is mixed with the plasma jet 37 in the reaction chamber 31. Thereby a large portion of the energy of the plasma jet 37 is transferred to the gas stream and/or particle stream in the carrier gas 40. Therefore only a very small portion of the plasma jet 37 comes in contact with the surface of the semiconductor substrate 10.

Ambient air may be excluded from the reaction chamber 31, for example, by applying a suitable pressure. This avoids undesired side reactions between ambient air, plasma jet 37 and carrier gas 40.

The plasma deposition method as described above allows to produce the metal layers 13 and 19 of plasma deposited metal particles 14. The plasma deposition method is also called plasma brushing method. When using the plasma deposition method described above, the velocity of the metal particles 14 and the process temperature are comparably low. The metal particles 14 are designed such that no oxidation of the metal particles 14 occurs during the plasma deposition method.

Figure 10:
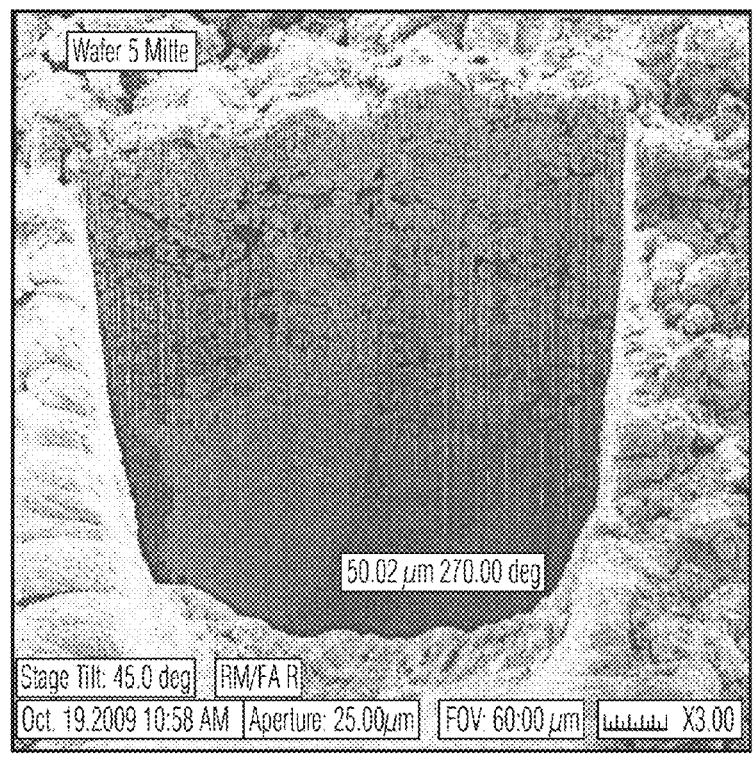
FIG. 10 shows an electron microscope image of a layer of metal particles.

FIG. 10 is an electron microscope image of a layer of metal particles deposited by means of a plasma deposition apparatus as described above. A hole is generated in the layer of metal particles by focus ion beam technology.

Figure 11:
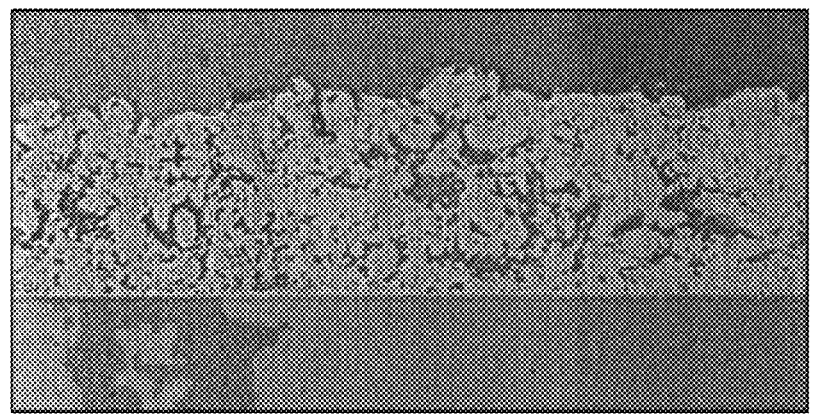
FIG. 11 shows an optical image of a layer of metal particles.

FIG. 11 is an optical image of a section through a layer of metal particles deposited by means of a plasma deposition apparatus as described above. It can be seen from FIGS. 9 and 10 that the layer of metal particles exhibits a certain porosity due to the plasma deposition.

Figure 12:
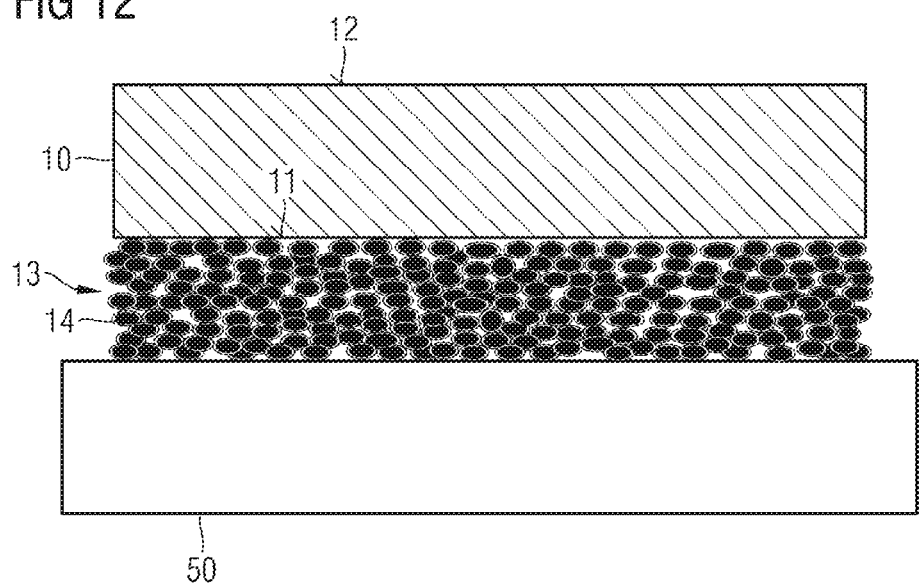
FIG. 12 schematically illustrates a cross-sectional view of one embodiment of a semiconductor substrate mounted on a carrier.

FIG. 12 schematically illustrates a cross-sectional view of the semiconductor substrate 10 as illustrated in FIG. 1B mounted on a carrier 50 with its first main surface 11 and the metal layer 13 facing the carrier 50.

The carrier 50 may be of any shape, size or material. Further, the carrier 50 may be connected to other carriers 50. The carriers 50 may be connected among each other by connection means with the purpose of separating the carriers 50 in the course of the fabrication. Separation of the carriers 50 may be carried out by mechanical sawing, a laser beam, cutting, stamping, milling, etching or any other appropriate method. The carrier 50 may be electrically conductive. The carrier 50 may be entirely fabricated from metals or metal alloys, in particular, copper, copper alloys, iron nickel, aluminum, aluminum alloys, or other appropriate materials. In addition, the carrier 50 may be plated with an electrically conductive material, for example copper, silver, iron nickel or nickel phosphorus. The carrier 50 may be, for example, a leadframe or a part of a leadframe.

In one embodiment, the semiconductor substrate 10 illustrated in FIG. 12 is a semiconductor chip which is electrically coupled to the carrier 50 by means of the metal layer 13.

In order to join the metal layer 13 to the carrier 50, a diffusion soldering process may be performed. In one embodiment, a layer of solder material is deposited on the metal layer 13. The carrier 50 is heated by a hot plate or in an oven to a temperature above the melting point of the solder material. A pick-and-place tool is used capable of picking the semiconductor substrate 10 and placing it on the heated carrier 50. During the soldering process the semiconductor substrate 10 may be pressed onto the carrier 50 for an appropriate time in the range between 10 and 200 ms.

During the soldering process the solder material produces a metallic joint between the metal layer 13 and the carrier 50 which is able to withstand high temperatures through the fact that the solder material forms a temperature-resistant and highly mechanically stable intermetallic phase with high-melting materials of the metal layer 13 and the carrier 50. In the process, the low-melting solder material is completely transformed, i.e., it passes completely into the intermetallic phase. The process is diffusion-controlled and its duration increases as the thickness of the layer of the solder material rises.

In one embodiment, the semiconductor substrate 10 is joined to the carrier 50 by using a low temperature joining technique (LTJT). In this case, solder material can be omitted and the metal layer 13 is directly placed onto the upper surface of the carrier 50. It is therefore not necessary to raise the temperature to the melting temperature of solder material. Thus, temperatures lower than, for example, 300° C. are used for attaching the metal layer 13 to the carrier 50.

The corrosion-resistant shells 16 of the metal particles 14 contained in the metal layer 13 prevent the cores 15 of the metal particles 14 from oxidation. Thus, it is possible to use copper or aluminum for the core material, which both are likely to generate an oxidized surface. The shells 16 ensure that the metal layer 13 is free of undesirable oxides which would increase contact resistance and thus reduce electrical and also thermal conductivity.

In one embodiment, the first metal material of the cores 15 of the metal particles 14 has a higher hardness than the second metal material of the shells 16. For example, the first metal material is copper and the second metal material is silver or gold. In one embodiment, the first metal material has a lower hardness than the second metal material. In this case, the first metal material is, for example, copper or aluminum and the second metal material is one of palladium, titanium, tantalum and niobium.

In one embodiment, the first metal material of the cores 15 has a higher thermal expansion coefficient than the second metal material of the shells 16. For example, the first metal material is aluminum and the second metal material is one of silver, gold, palladium, titanium, tantalum and niobium. Alternatively, the first metal material is copper and the second metal material is one of gold, palladium, titanium, tantalum and niobium. In one embodiment, the first metal material of the cores 15 has a lower thermal expansion coefficient than the second metal material of the shells 16. For example, the first metal material is copper and the second metal material is silver. Different thermal expansion coefficients of the first and second material allow influence on the mechanical stress between the semiconductor substrate 10 and the carrier 50, which usually also have different thermal expansion coefficients, in temperature cycles. Thus, the mechanical stress may be reduced or, alternatively, may be increased. For example, increased stress in the drift zone of a power semiconductor chip leads to a reduction in power loss due to on-state resistance.

Figure 13:
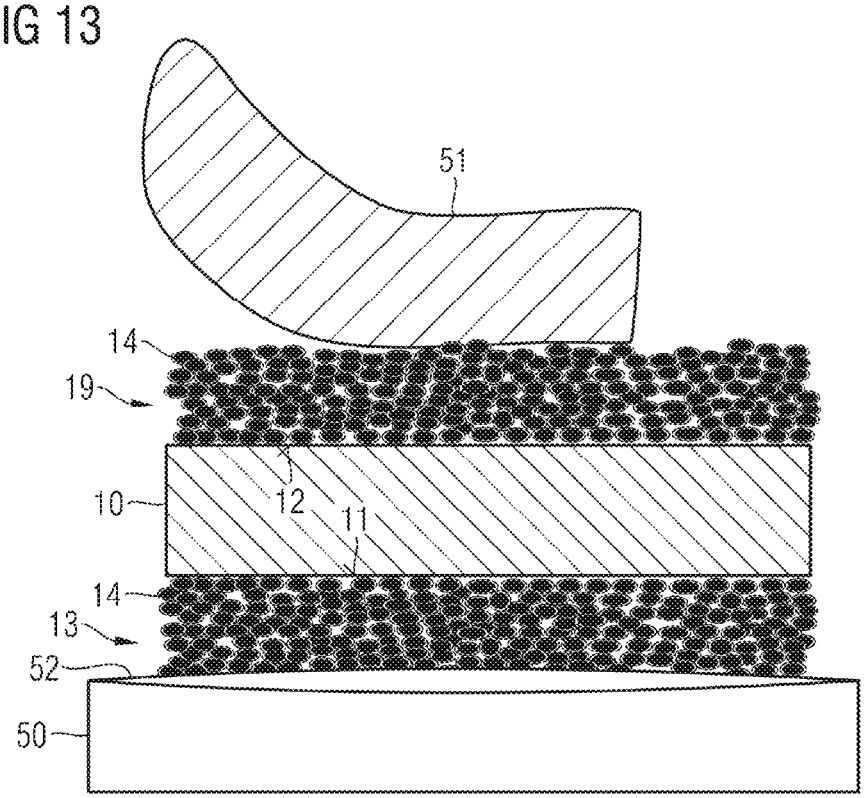
FIG. 13 schematically illustrates a cross-sectional view of one embodiment of a semiconductor substrate mounted on a carrier and a wedge bond attached to the semiconductor substrate.

FIG. 13 schematically illustrates a cross-sectional view of the semiconductor substrate 10 mounted on the carrier 50 as illustrated in FIG. 12 and, in addition, a wedge bond 51 attached to the metal layer 19 deposited on the second main surface 12 of the semiconductor substrate 10 (see also FIG. 4). In the embodiment illustrated in FIG. 13, the semiconductor substrate 10 is a semiconductor chip, in particular, a power semiconductor chip, and the carrier 50 is a leadframe.

The wedge bond 51 is attached directly onto the metal layer 19. For this purpose, the end of an bonding wire is pressed using a wedge or a needle-shaped bonding tool onto the metal layer 19. By using a short ultrasound impulse, the bonding wire is then melted on and fused to the surface of the metal layer 19. The electrical bond between the bonding wire and the metal layer 19 is formed. The wedge then moves from the first bonding point to the second bonding point, for example, located on pins or leads of the carrier 50. The bonding process is repeated here, whereby the bonding wire is additionally cut off.

FIG. 13 also illustrates an intermetallic phase 52 produced by a diffusion soldering process at the interface between the semiconductor substrate 10 and the carrier 50.

Figure 14:
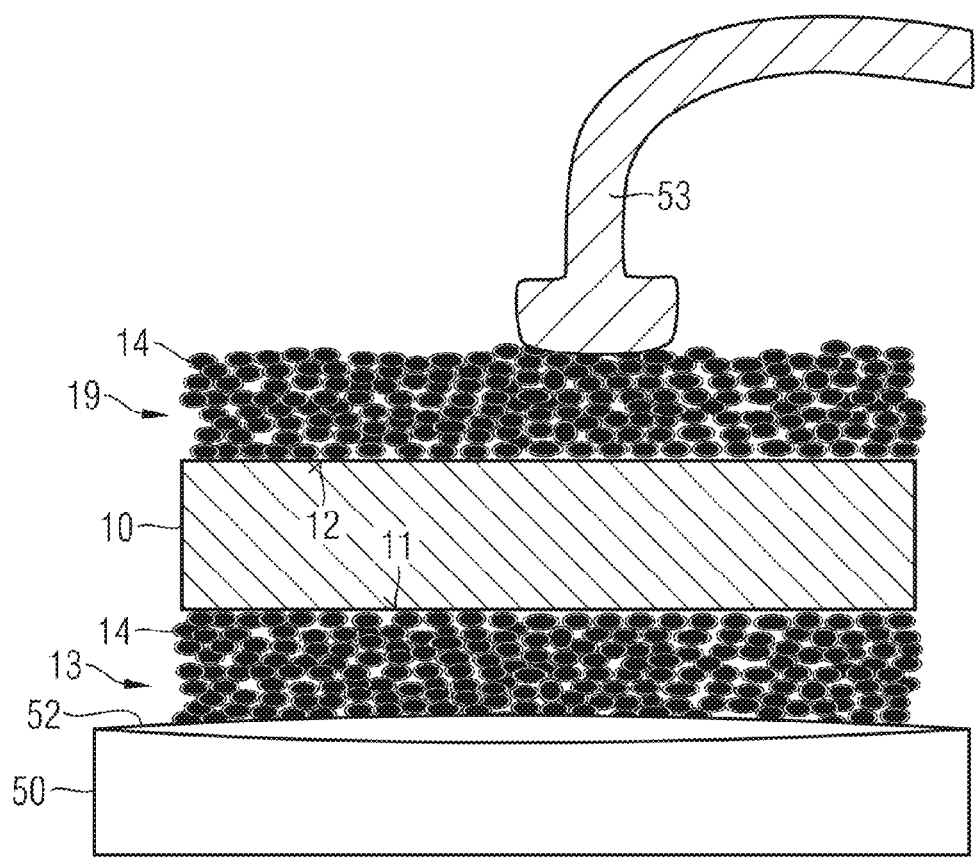
FIG. 14 schematically illustrates a cross-sectional view of one embodiment of a semiconductor substrate mounted on a carrier and a nail bond attached to the semiconductor substrate.

FIG. 14 schematically illustrates a cross-sectional view of the semiconductor substrate 10 mounted on the carrier 50 similar to the embodiment illustrated in FIG. 13. In contrast to FIG. 13, the embodiment illustrated in FIG. 14 includes a nail or ball bond 53 that is attached directly onto the metal layer 19. For this type of bonding technique, a needle-like capillary is used, through which the bond wire is fed. A high-voltage electric charge is applied to the bond wire. This melts the bond wire at the tip of the capillary. The tip of the bond wire forms into a nail or ball because of the surface tension of the molten metal. The nail or ball quickly solidifies, and the capillary is lowered to the surface of the metal layer 19, which is typically heated. The capillary is then pushed down and ultrasonic energy is applied with an attached transducer. The combined heat, pressure and ultrasonic energy create a weld between the nail or ball formed at the tip of the bond wire and the surface of the metal layer 19. Next the bond wire is passed out through the capillary and the capillary moves from the first bonding point to the second bonding point, for example, located on pins or leads of the carrier 50. The bonding process is repeated here, whereby the bonding wire is additionally cut off.

Figure 15A:
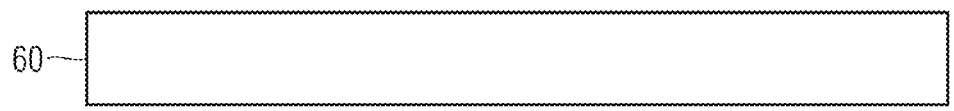
FIGS. 15A-15C schematically illustrate a cross-sectional view of one embodiment of a method for producing a via in a substrate.
Figure 15B:
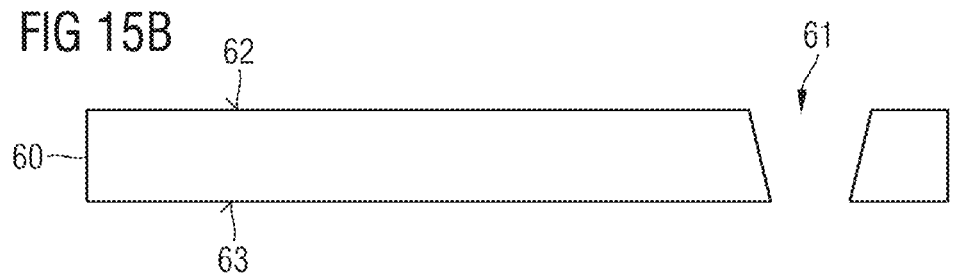
Figure 15C:
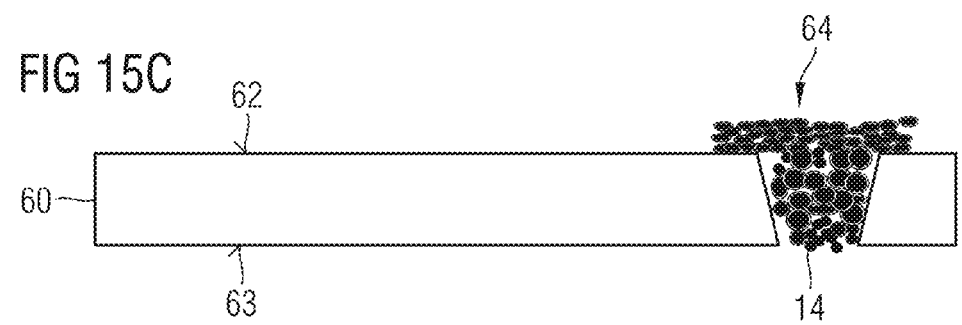

FIGS. 15A-15C schematically illustrate a cross-sectional view of an embodiment where the metal particles 14 of FIG. 2 are used to produce a via in a substrate.

FIG. 15A schematically illustrates a substrate 60. In one embodiment, the substrate 60 is a semiconductor substrate, for example, a semiconductor chip. In one embodiment, the substrate 60 includes a semiconductor chip embedded in an encapsulation material, for example, a molding compound, a laminate or a prepreg.

FIG. 15B schematically illustrates a through hole 61 produced in the substrate 60. The through hole 61 extends from a first main surface 62 to an opposite second main surface 63 of the substrate 60. The through hole 61 may be created by using laser ablation, mechanical drilling, etching or any other appropriate technique. In case the substrate 60 includes an encapsulation material covering a semiconductor chip, the through hole 61 may extend entirely through the encapsulation material.

FIG. 15C schematically illustrates that the metal particles 14 including cores 15 and shells 16 as described above are filled into the through hole 61 to produce an electrically conductive via 64. The via 64 extends from the first main surface 62 to the second main surface 63 of the substrate 60. In addition, contact pads may be produced on the first main surface 62 and/or the second main surface 63. Various techniques may be employed to deposit the metal particles 14 in the through hole 61, for example, spraying, printing, dispensing or plasma deposition as described above and illustrated in FIG. 9.

Figure 16:
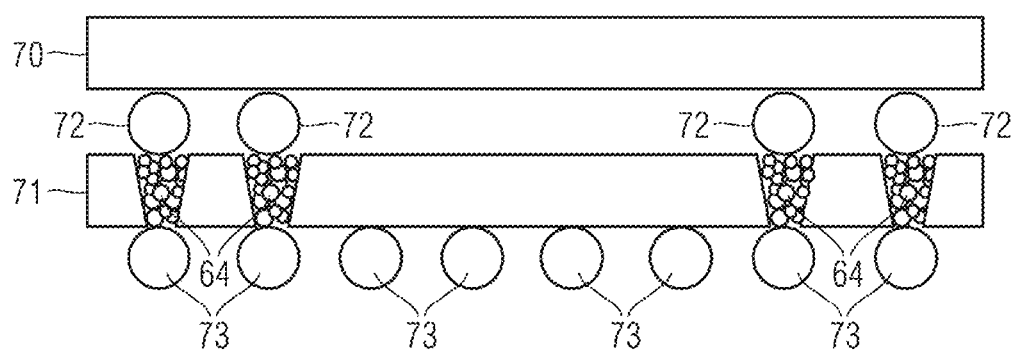
FIG. 16 schematically illustrates a cross-sectional view of one embodiment of a device including two packages stacked on top of each other.

FIG. 16 schematically illustrates a cross-sectional view of a device including two packages 70 and 71 stacked on top of each other. Each of the packages 70 and 71 includes one or more semiconductor chips. The semiconductor chips may be embedded in an encapsulation material, for example, a molding compound, a laminate or a prepreg. The package 71 includes several vias 64 filled with the metal particles 14 as described above in connection with FIG. 15C. The package 70 is electrically coupled to the vias 64 by means of solder balls 72. In addition, solder balls 73 are attached to the lower surface of the package 71 and the vias 64. The solder balls 73 allow to mount the package 71 on a circuit board.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor device, the method comprising:
   providing a semiconductor substrate having a first surface; and
   forming a first metal layer on the first surface of the semiconductor substrate by plasma depositing metal particles on the first surface of the semiconductor substrate, wherein the metal particles comprise cores comprising a first metal material and shells surrounding the cores, wherein the shells comprise a second metal material that is resistant to oxidation and wherein the metal particles are larger than 300 nm.

2. The method of claim 1, wherein the first metal material is selected from the group consisting of copper and aluminum.

3. The method of claim 1, wherein the second metal material is selected from the group consisting of silver, gold, palladium, titanium, tantalum and niobium.

4. The method of claim 1, wherein the second metal material comprises a noble metal.

5. The method of claim 1, wherein the semiconductor substrate comprises a power integrated circuit.

6. The method of claim 1, further comprising dicing the semiconductor substrate into separate semiconductor chips after forming the first metal layer.

7. The method of claim 1, wherein plasma depositing the metal particles comprises generating a plasma jet in a first region and mixing the plasma jet with a carrier gas comprising the metal particles.

8. The method of claim 7, wherein mixing the plasma jet with the carrier gas comprises mixing the plasma jet and the carrier gas in a reaction chamber that is physically separated from the first region.

9. The method of claim 1, further comprising attaching a bond wire directly onto the first metal layer.

10. The method of claim 1, further comprising attaching the semiconductor substrate to a metal carrier with the first metal layer facing the metal carrier.

11. The method of claim 1, wherein a thermal expansion coefficient of the first metal material is higher than a thermal expansion coefficient of the second metal material.

12. The method of claim 1, wherein a thermal expansion coefficient of the first metal material is lower than a thermal expansion coefficient of the second metal material.

13. The method of claim 1, wherein the first metal layer forms a contact pad.

14. The method of claim 1, further comprising producing a through hole in the semiconductor substrate and filling the through hole with the metal particles.

15. The method of claim 1, further comprising depositing a layer of solder material on the first metal layer.

16. A method for producing semiconductor chips, the method comprising:
providing a semiconductor wafer;
forming a metal layer on the semiconductor wafer comprising plasma depositing metal particles on the semiconductor wafer, wherein the metal particles comprise cores, wherein the cores are selected from the group consisting of copper and aluminum, and shells surrounding the cores, wherein the shells are selected from the group consisting of silver, gold, palladium, titanium, tantalum and niobium, and wherein the metal particles are larger than 300 nm; and
dicing the semiconductor wafer thereby separating the semiconductor chips.

17. The method of claim 1, wherein the first metal material comprises aluminum.

18. The method of claim 1, wherein the second metal material is selected from the group consisting of titanium, tantalum, and niobium.

19. The method of claim 1, wherein the semiconductor substrate comprises a power transistor.

20. The method of claim 1, wherein the metal layer has a surface roughness, wherein the surface roughness of the metal layer is from 300 nm to 500 nm.

21. The method of claim 1, wherein the metal layer entirely covers the first surface of the semiconductor substrate.

22. The method of claim 1, wherein the semiconductor substrate has a second surface opposite the first surface, wherein the method further comprises forming a second metal layer on the second surface of the semiconductor substrate comprising depositing metal particles on the second surface of the semiconductor substrate, wherein the metal particles comprise cores comprising the first metal material and shells surrounding the cores, wherein the shells comprise the second metal material.

23. The method of claim 1, wherein the first metal layer has a thickness of from 1 micron to 200 microns.

24. The method of claim 1, further comprising:
applying a solder material to the first metal layer;
heating a carrier above a melting point of the solder material;
placing the semiconductor substrate on the heated carrier; and
pressing the semiconductor substrate on the heated carrier.

* * * * *